(12) United States Patent
Halliyal et al.

(10) Patent No.: US 6,731,006 B1
(45) Date of Patent: May 4, 2004

(54) DOPED COPPER INTERCONNECTS USING LASER THERMAL ANNEALING

(75) Inventors: Arvind Halliyal, Cupertino, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/323,941

(22) Filed: Dec. 20, 2002

(51) Int. Cl.$^7$ .................. H01L 23/48; H01L 23/52; H01L 29/40
(52) U.S. Cl. .................................. 257/758; 257/750
(58) Field of Search ................... 257/758, 750, 257/762; 438/663, 664

(56) References Cited

U.S. PATENT DOCUMENTS 5,966,605 A * 10/1999 Ishida
6,156,654 A * 12/2000 Ho et al.
6,365,446 B1 * 4/2002 Chong et al.

* cited by examiner

*Primary Examiner*—Sheila V. Clark

(57) ABSTRACT

A semiconductor device and method of making the same includes a first metallization level, a first etch stop layer, a dielectric layer and an opening extending through the dielectric layer and the first etch stop layer. The first etch stop layer is disposed over the first metallization level. Metal within the opening forms a second metal feature, and the metal can comprise copper or a copper alloy. Dopants are introduced into the metal and are activated by laser thermal annealing. A concentration of the dopants within the metal in a lower portion of the second metal feature proximate the first metal feature is greater than a concentration of dopants in a central portion of the second metal feature, and a concentration of the dopants within the metal in an upper portion of the second metal feature is greater than a concentration of dopants in the central portion of the second metal feature.

20 Claims, 12 Drawing Sheets

DOPED COPPER INTERCONNECTS USING LASER THERMAL ANNEALING

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the su-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene"-type processing. Generally, this process involves forming a via opening in the inter-metal dielectric layer or interlayer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the W plug interconnect problem involves depositing W using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization levels. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

One drawback of using copper or Cu-based alloys is that copper diffuses rapidly through various materials. Unlike aluminum, copper also diffuses through dielectrics, such as silicon oxide. When copper diffuses through dielectrics, it can cause damage to neighboring devices on the semiconductor substrate. To prevent diffusion, materials such as tantalum nitride, titanium nitride, or tungsten nitride are used as barrier materials for copper. A thin adhesion layer formed of an adhesion material, such as tantalum, titanium, or tungsten is typically first deposited on the dielectrics or via to ensure good adhesion and good electrical contact of the subsequently deposited barrier layers to underlying doped regions and/or conductive regions. Adhesion/barrier layer stacks formed of adhesion/barrier materials such Ta/TaN, Ti/TiN, and W/WN have been found to be useful as adhesion/barrier material combination for copper interconnects.

However, even with these various types of barrier layers, copper is still subject to strong electromigration, or the movement of copper atoms along the channels or vias under the influence of electrical current. Electromigration also tends to occur at the copper/barrier interface. One proposed solution to the electromigration problem has been to dope the copper with various dopants. These dopants typically have two effects. First, the dopants act to slow the lattice and grain boundary diffusion of copper atoms. Second, depending on the dopant and the concentration of the dopant, the dopant can slow the migration of copper atoms along the copper/barrier interface or a copper/passivation interface. After doping, the entire semiconductor device is subject to a thermal annealing to activate the dopants.

One problem associated with doping copper is that activation of the dopants by thermal annealing requires that all the features on a semiconductor device be subject to annealing and not just the features that are to be annealed. As is well known in the art, many of the features on a semiconductor device are sensitive to heat, and these features can be detrimentally affected by a thermal annealing process. As such, the parameters of current thermal annealing processes must be chosen so as to not detrimentally affect other features on the semiconductor. Another problem associated with thermal, annealing is that the process is relatively time-consuming because a considerable length of time is required to heat the semiconductor device to the proper annealing temperature.

Another problem associated with the above-identified processes is that the dopant only penetrates the top of the copper layer. As such, the dopant may not completely reach all regions in which the presence of dopants can reduce electromigration. Accordingly, a need exists for an improved method of forming copper plugs and copper metallization that allows for improved dopant concentration within the plugs or metallization and while providing a less time-consuming process and greater process flexibility.

SUMMARY OF THE INVENTION

This and other needs are met by embodiments of the present invention which provide a semiconductor device. The semiconductor device includes a first metallization level, a first etch stop layer, a dielectric layer, and an opening. The first etch stop layer is disposed over the first metallization level and the first diffusion barrier layer, and the dielectric layer is disposed over the first etch stop layer. The opening extends through the dielectric layer and the first etch stop layer. The first metallization level includes a first metal feature, and metal within the opening forms a second metal feature. Dopants that reduce electromigration are introduced into the metal, and the dopants are activated by laser thermal annealing. The metal can be copper or a copper alloy.

By activating the dopants with laser thermal annealing, the total energy being supplied to the semiconductor device by the laser thermal annealing process can be reduced. Furthermore, the laser thermal annealing process is considerably shorter than a typical furnace annealing process. Also, the laser thermal annealing process more evenly distributes the dopants within the metal.

In another aspect of the invention, a concentration of the dopants within the metal in a lower portion of the second metal feature proximate the first metal feature is greater than a concentration of dopants in a central portion of the second metal feature. Also, a concentration of the dopants within the metal in an upper portion of the second metal feature is greater than a concentration of dopants in the central portion of the second metal feature. The upper and lower portions have depths equal to about 5% to about 15% of a depth of the second feature, and the central portion has a depth equal to about 70% to about 90% of a depth of the second feature.

In a further embodiment of the present invention, a method of manufacturing a semiconductor device is also disclosed. The method of manufacturing includes forming a first etch stop layer over the first metallization level; forming a dielectric layer over the first etch stop layer; forming an opening through the dielectric layer and the first etch stop layer; and filling the opening with metal to form a second metal feature. Dopants are then introduced into the metal and the metal is laser thermal annealed to activate the dopants.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of excessive heating during thermal annealing used to activate dopants within copper interconnects. This is achieved, in part, by activating the dopants using laser thermal annealing. Advantageously, the laser thermal annealing process introduces less total energy into the semiconductor device and more evenly distributes the dopants within the copper. Furthermore, use of the laser thermal annealing process allows for greater process flexibility in creating copper layers having different dopant concentrations. This is accomplished by forming multiple copper layers and selectively doping/laser thermal annealing those areas which are to include dopants.

Figure 1A:
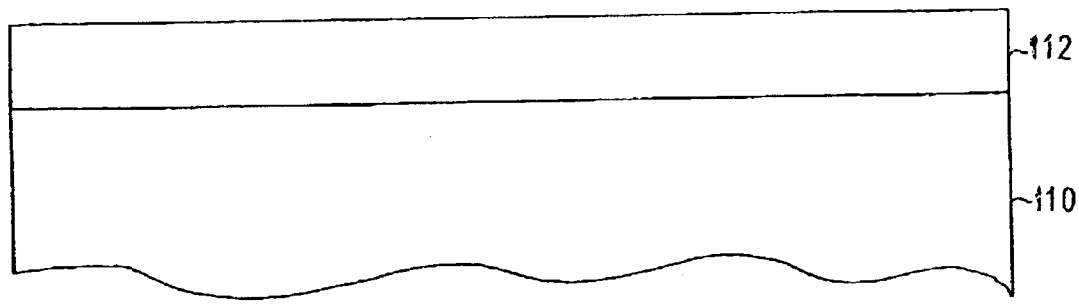
FIGS. 1A–1H schematically illustrate sequential phases of a single damascene process according to an embodiment of the present invention.

An embodiment of the present invention is illustrated in FIGS. 1A–1G. As illustrated in FIG. 1A, a first etch stop layer 112 is formed over a first metallization level 110. The first etch stop layer 112 acts as a passivation layer that protects the first metallization level 110 from oxidation and contamination and prevents the material of the metallization level 110 from diffusing into a subsequently formed dielectric layer. The first etch stop layer 112 also acts as an etch stop during subsequent etching of a dielectric layer formed above the first etch stop layer 112. In at least one aspect of the invention, the first etch stop layer 112 is formed from silicon nitride, although the invention in not limited in this manner. Silicon nitride, however, has the advantage of acting as an etch stop to many etchants used to etch dielectric material, including low-k dielectric materials. The metallization level 110 can be formed from any conductive material, and in at least one aspect, the first metallization level 110 is formed from a Cu or Cu-based alloy.

Although not limited in this manner, the thickness of the first etch stop layer 112 can be chosen so as to be sufficient to act as an etch stop during etching of the dielectric layer. In at least one aspect of the invention, the thickness of the first etch stop layer 112 is at least 20 nanometers, and in another aspect of the invention, the thickness of the first etch stop layer 112 is from about 40 to about 60 nanometers. Any process capable of depositing the first etch stop layer 112 is acceptable for use with the invention, and an illustrative process for depositing silicon nitride is PECVD.

Figure 1B:
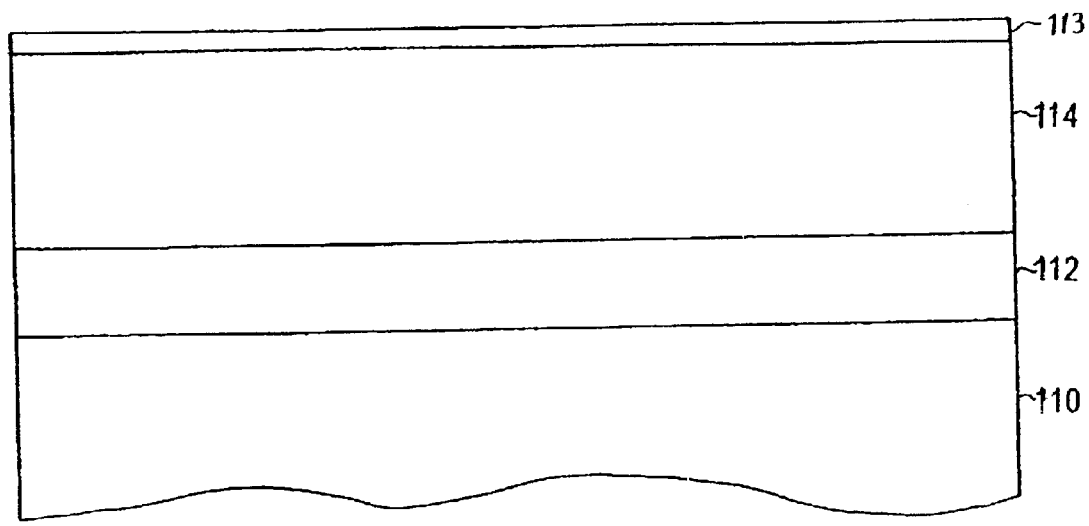

In FIG. 1B, a first dielectric layer 114 is deposited over the first etch stop layer 112. The first dielectric layer 114 can be formed from any material capable of acting as a dielectric, and illustrative materials include silicon oxide and silicon nitride. In at least one aspect of the invention, the first dielectric layer 114 is formed from a low-k dielectric material. Illustrative examples of low-k dielectric materials include fluorosilicate glass (FSG or SiOF), hydrogenated diamond-like carbon (DLC), polystyrene, fluorinated polyimides, parylene (AF-4), polyarylene ether, and polytetrafluoro ethylene. In another aspect of the invention, the first dielectric layer 114 is formed from a porous low-k dielectric material, such as siloxanes, silsesquioxanes, aerogels, and xerogels. These low-k dielectric materials can be applied via conventional spin-coating, dip coating, CVD, PECVD, spraying, meniscus coaling methods, in addition to other coating methods that are well-known in the art.

After formation of the first dielectric layer 114, a capping layer 113 can be formed over the first dielectric layer 114. A function of the capping layer 113 can be to protect the first dielectric layer 114 from a process that removes a subsequently formed resist layer, and any material so capable is acceptable for use with the invention. The capping layer 113 can also be used as a mechanical polishing stop that reduces damage to the first dielectric layer 114 during subsequent polishing away of conductive material that is deposited over the first dielectric layer 114 and in a subsequently formed via. Examples of materials used as a capping layer 113 include silicon oxide and silicon nitride. In at least one aspect of the invention, the capping layer 113 is formed from silicon oxide and has a thickness of at least 5 nanometers. In another aspect of the invention, the thickness of the capping layer 113 is from about 40 to about 60 nanometers.

Figure 1C:
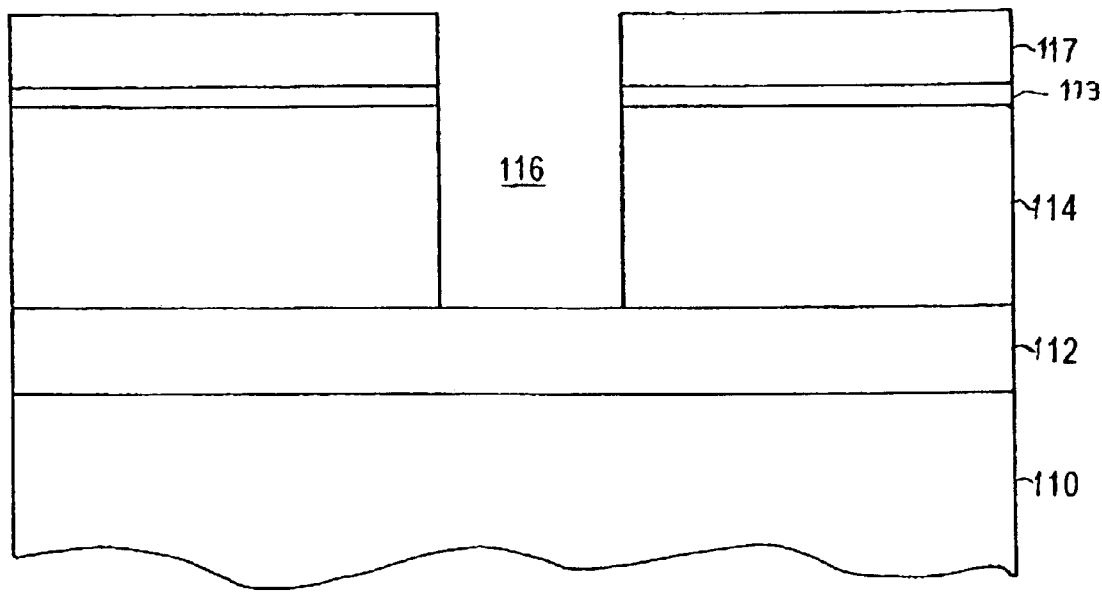

In FIG. 1C, an opening 116 is formed in the first dielectric layer 114. Although not limited in this manner, the opening can be a via opening, a trench, or a dual damascene opening comprising a lower via opening in communication with an upper trench. The opening 116 can be formed in the first dielectric layer 114 using any known method. One example is to use conventional lithographic techniques, for example, optical lithography (including, for example, I-line and deep-UV), X-ray, and E-beam lithography, followed by etching. The lithographic process typically involves depositing a resist 117 over the first dielectric layer 114 and exposing and developing the resist 117 to form the desired pattern of the opening 116.

A first etch, which is highly selective to the materials of the capping layer 113 (if used) and the first dielectric layer 114, removes the capping layer 113 and the first dielectric layer 114 until the etchant reaches the first etch stop layer 112. The first etch is typically an anisotropic etch, such as a reactive ion plasma dry etch, that removes only the exposed portions of the first dielectric layer 114 directly below the opening in the resist 117. By using an anisotropic etch, the opening 116 can be formed with substantially vertical sidewalls.

Figure 1D:
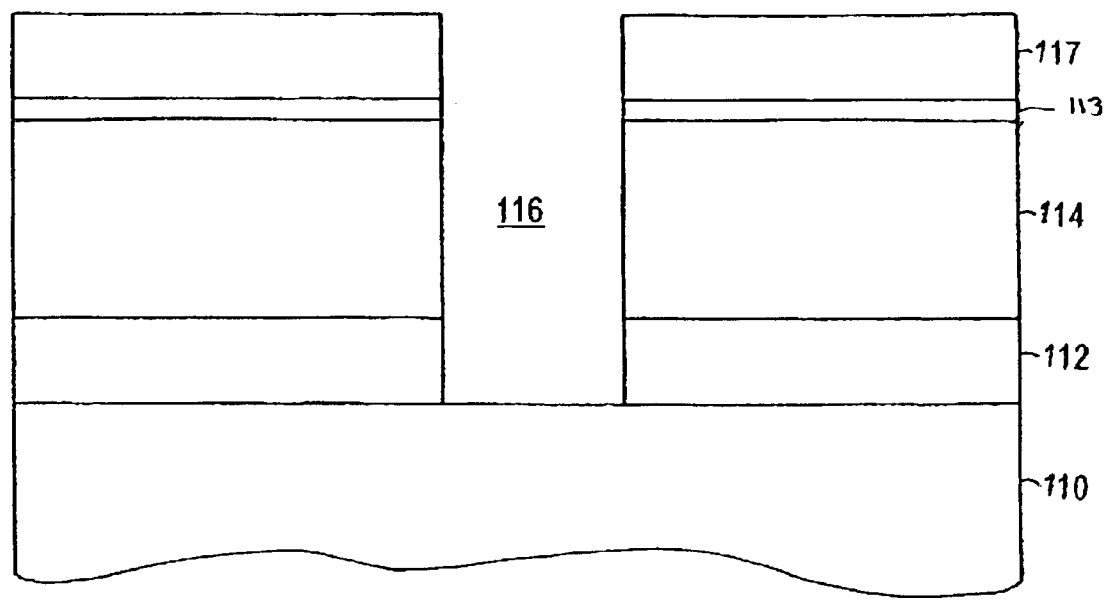

In FIG. 1D, a second etch, which is highly selective to the material of the first etch stop layer 112, removes the first etch stop layer 112 until the etchant reaches the first metallization level 110. The second etch can also be an anisotropic etch.

Figure 1E:
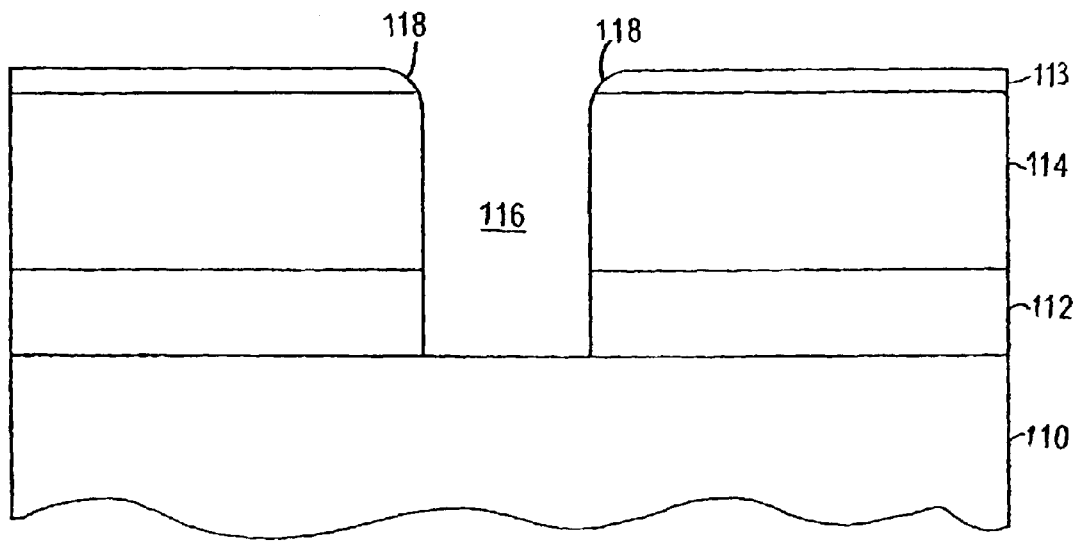

In FIG. 1E, the corners 118 of the vias 116 can be rounded using a reverse physical sputtering process. The corners 118 of the vias 116 are rounded to prevent problems of void creation associated with subsequent deposition of the conductive plug, and if necessary, a barrier layer. The reverse sputtering process can also be used to clean the first metallization layer 110 at the bottom of the via 116. Incomplete etching of the first etch stop layer 112 can leave a portion of the first etch stop layer 112 over the first metallization layer 110, and this material can prevent good ohmic contact between the material of the conductive plug and the material of the first metallization layer 110. Use of the reverse sputtering process, however, can advantageously remove any remaining material of the first etch stop layer 112 and any other contaminants on the first metallization layer 110. Prior to formation of the adhesion/barrier material, the resist 117 can be removed, and the invention is not limited as to a particular manner in which the resist 117 is removed.

Figure 1F:
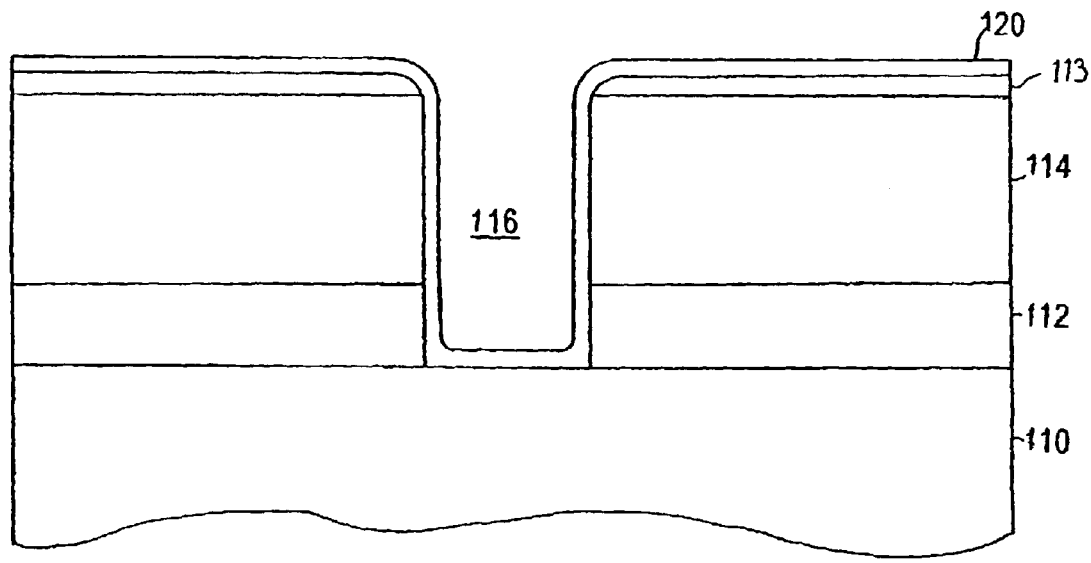

In FIG. 1F, an adhesion/barrier material, such as tantalum, titanium, tungsten, tantalum nitride, or titanium nitride, can be deposited in the opening 116. The combination of the adhesion and barrier material is collectively referred to as a first diffusion barrier layer 120. The first diffusion barrier layer 120 acts to prevent diffusion into the first dielectric layer 114 of the conductive material subsequently deposited into the opening 116.

Figure 1G:
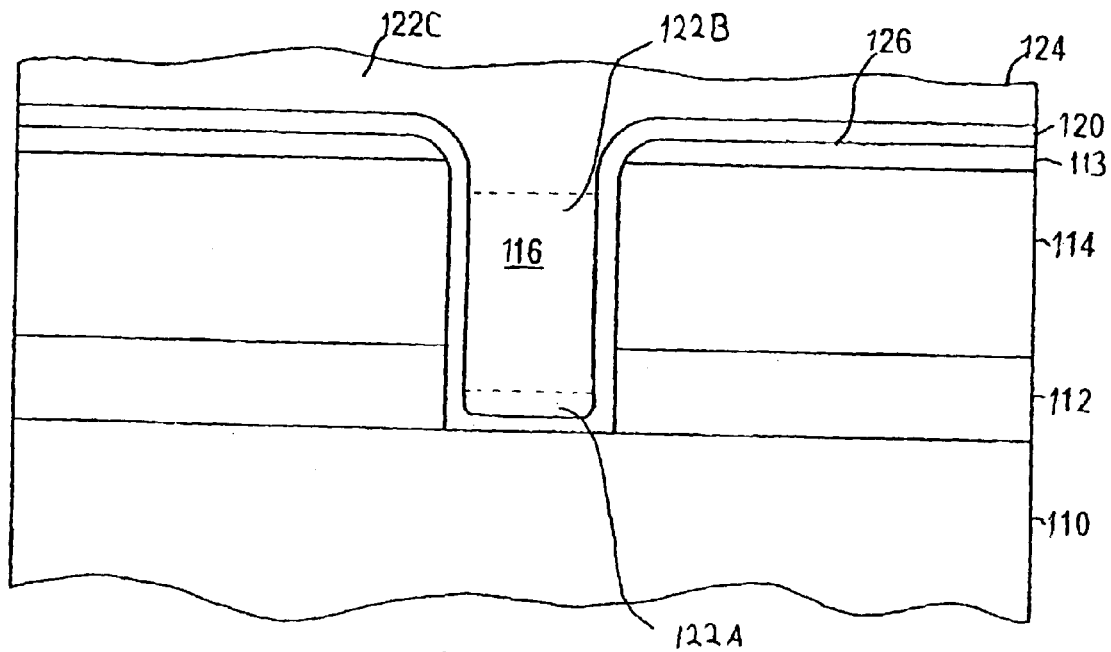

In FIG. 1G, after formation of the first diffusion barrier layer 120, a layer of a conductive material 122 is deposited into the opening 116. Although not limited in this manner, the conductive material 122 can be a Cu or Cu-based alloy, and any process capable of depositing the conductive material into the opening 116 is acceptable for use with this invention.

After some or all of the conductive material 122 has been deposited into the opening 116, in various aspects of the invention, dopants are introduced into the conductive material. The dopants can also be introduced into the copper during the deposition of the copper. The dopants can include, but is not limited to, palladium, nickel, tantalum, aluminum, chromium, titanium, magnesium, boron, tin, zirconium, carbon, or combinations thereof. The dopants can be selected to reduce electromigration of copper or the movement of copper atoms along the channels or vias 116 under the influence of electrical current., The amount of dopants is not limited in any manner. However, in certain aspects of the invention, the amount of dopants is selected so as to be distributed through the conductive material 122 at a concentration of between about 0.1 and about 2.0% atomic concentration.

After the dopants have been introduced into the conductive material 122, the conductive material 122 is exposed to laser thermal annealing. Although not limited in this manner, the process parameters of the laser thermal annealing are selected to evenly distribute the dopants within the conductive material 122. Also, the laser thermal annealing process can skip over portions of the semiconductor device that do not include channels or vias 116.

Illustrative examples of lasers capable of being used for this process include a spatially homogenized 308 nm XeCl pulsed laser, an excimer or Nd-YAG pulsed laser, although the invention is not limited in this manner. Examples of process parameters that can be varied include energy fluence, which can be modified by adjusting the power or wattage of the pulses, the number of pulses of the laser, and/or the length of the pulses. For example, the fluence range for laser irradiation can extend from about 50 mJ/cm$^2$ to about 1.3 J/cm$^2$. Also, the duration of the pulse can be, for example, between about 10 to about 1,000 nanoseconds.

Figure 2A:
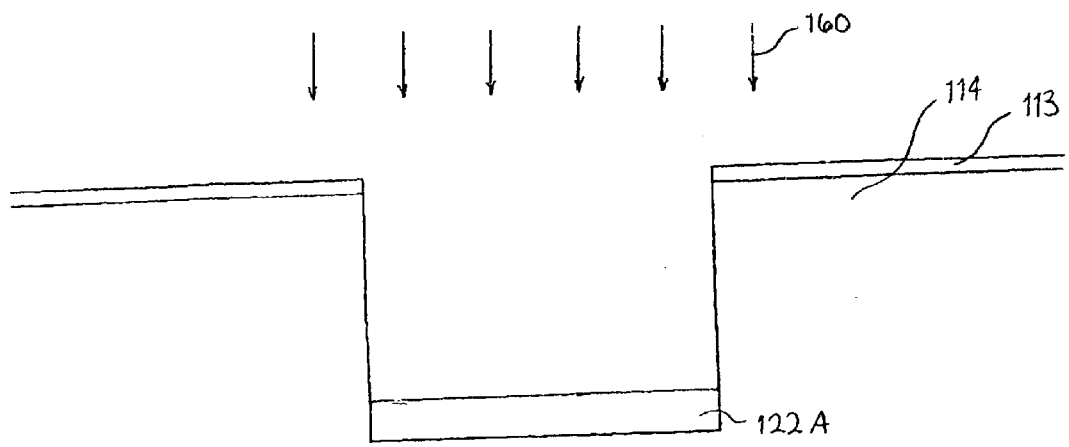
FIGS. 2A–2C schematically illustrate sequential phases of introducing dopants into a conductive layer and activating the dopants according to an embodiment of the present invention.
Figure 2B:
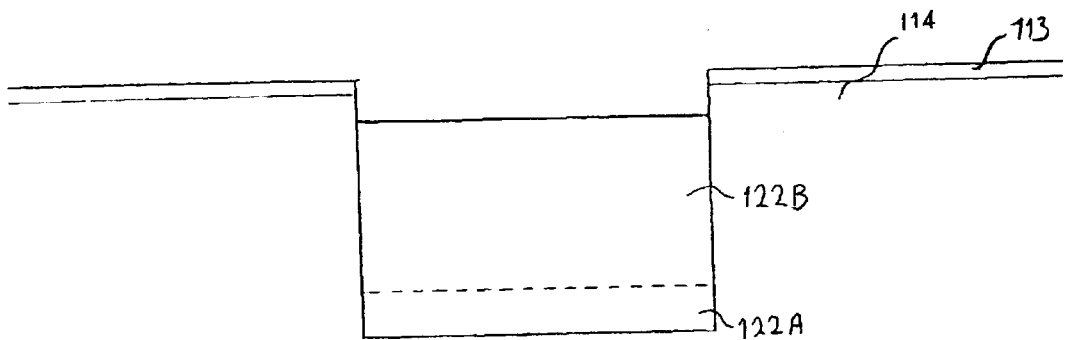
Figure 2C:
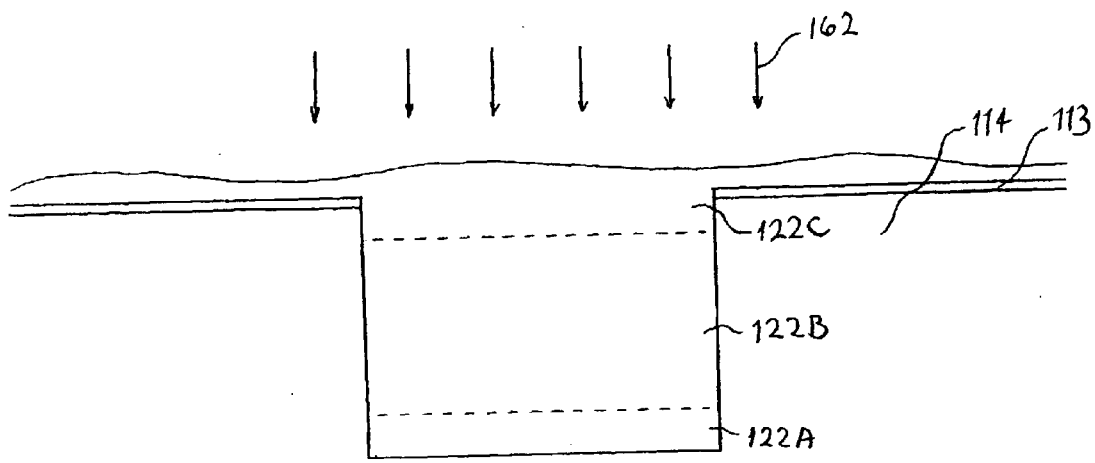

An example of this laser thermal anneal process is illustrated in FIGS. 2A–2C. In FIG. 2A, a first conductive layer 122A is formed in the opening 116. Although not limited as to a particular thickness, a thickness of the first conductive layer 122A is from about 5% to about 15% of a total depth of the opening 116. After the first conductive layer 122A is formed, the dopants, represented by arrows 160, are introduced into the first conductive layer 122A, and the first conductive layer 122A is subjected to laser thermal annealing. After laser thermal annealing, the dopants are substantially evenly distributed within the first conductive layer 122A.

In FIG. 2B, a second conductive layer 122B is formed in the opening 116. Although not limited as to a particular thickness, a thickness of the first conductive layer 122B is from about 70% to about 90% of a total depth of the opening 116.

In FIG. 2C, a third conductive layer 122C is formed in the opening 116. Although not limited as to a particular depth, so as to ensure complete filling of the opening 116, the third conductive layer 122C can be deposited as a blanket (or "overburden") layer 124 so as to overfill the opening 116 and cover an upper surface 126 of the capping layer 113. Although not limited as to a particular thickness, a thickness of the third conductive layer 122C is from about 5% to about 15% of a total depth of the opening 116. After the third conductive layer 122C is formed, dopants, represented by arrows 162, are introduced into the third conductive layer 122C, and the third conductive layer 122C is subjected to laser thermal annealing. After laser thermal annealing, the dopants are substantially evenly distributed within the third conductive layer 122C.

Figure 3A:
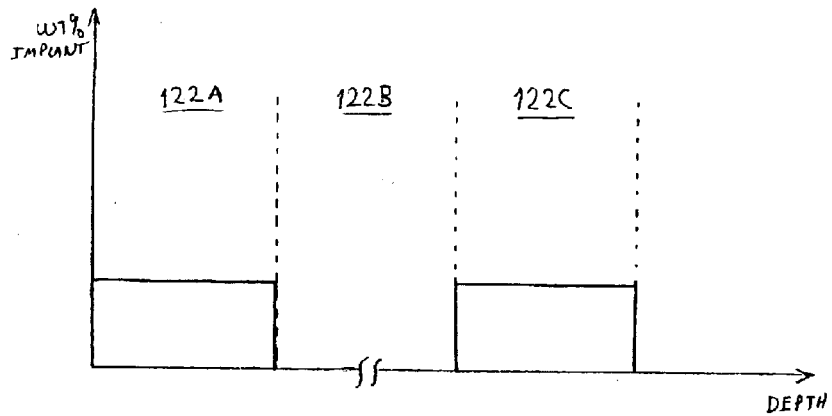
FIGS. 3A–3C graphically illustrate concentrations of the dopants within the conductive layer as a function of a depth of the conductive layer.
Figure 3B:
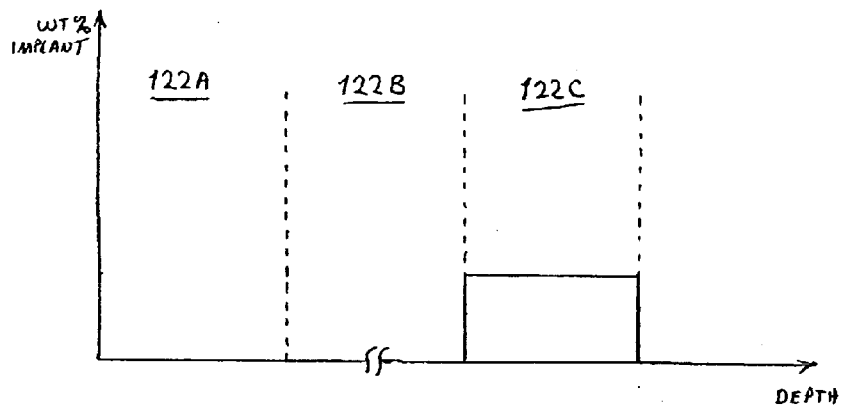
Figure 3C:
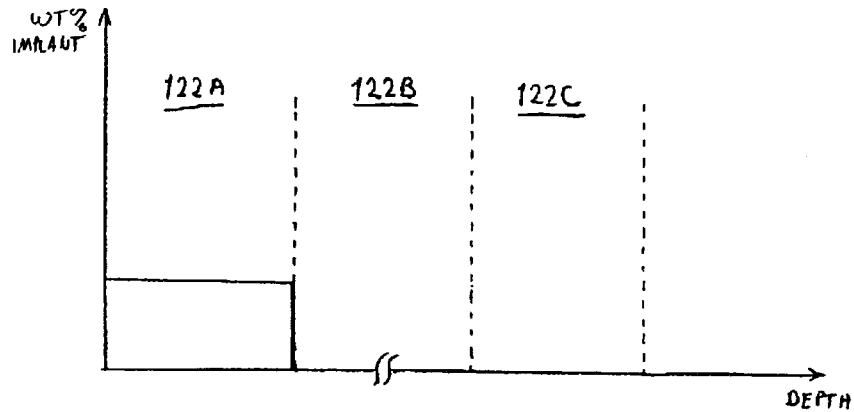

The invention, however, is not limited as to the particular process described above. For example, in a first alternative, the first and second conductive layers 122A, 122B can be combined and be formed without the dopants. In a second alternative, the second and third conductive layers 122B, 122C can be combined and be formed without the dopants. FIG. 3A is a representative graph illustrating the atomic percent of the dopants as a function of depth of the opening 116 using the process illustrated in FIGS. 2A–2C. FIGS. 3B and 3C are similar graphs respectively for the first and second alternatives.

Figure 1H:
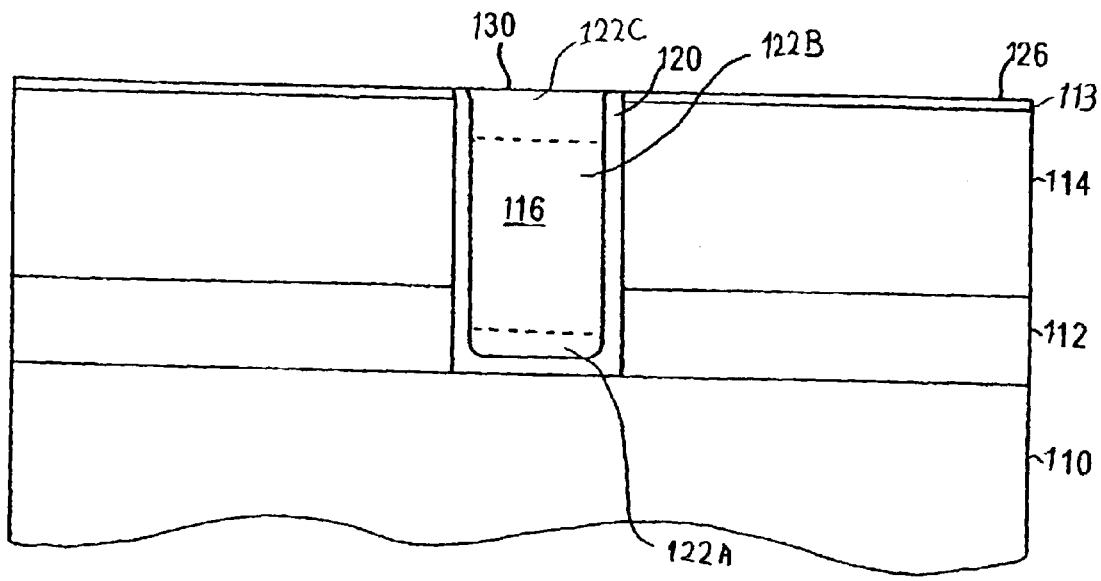

Referring back to FIG. 1H, the entire excess thickness of the metal overburden layer 124 over the upper surface 126 of the capping layer 113 can be removed using, for example, a CMP process. A typical CMP process utilizes an alumina ($Al_2O_3$)-based slurry and leaves a conductive plug in the opening 116. The conductive plug typically has an exposed upper surface 130 that is substantially co-planar with an upper surface of the first dielectric layer 114 (not shown) or the upper surface 126 of the capping layer 113.

Additional aspects of the present invention are illustrated in FIGS. 4A–4K. The dual damascene process to be described is illustrative of one sequence of steps, which can be used to practice the invention. In particular, the process provides a dual damascene structure, which includes a first metallization level, over which first and second dielectric layers are disposed, and the first and second dielectric layers respectively include a via and trench filled with a conductive material. However, the invention is not limited to the particular sequence of steps described to provide the dual damascene structure, as other sequence of steps capable of providing the dual damascene structure can be used to practice the invention.

Figure 4A:
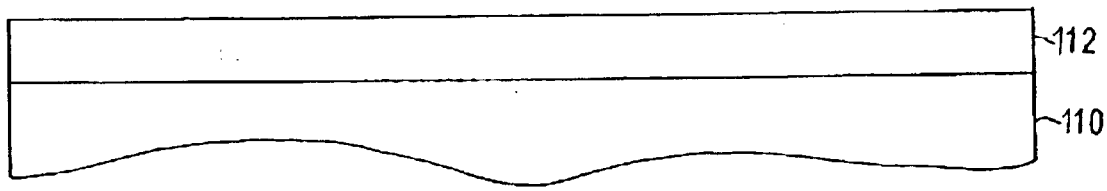
FIGS. 4A–4L schematically illustrate sequential phases of a dual damascene process according to an additional embodiment of the present invention.

As illustrated in FIG. 4A, a second etch stop layer 112 is formed over a first metallization level 110. The second etch stop layer 112 acts as a passivation layer that protects the first metallization level 110 from oxidation and contamination and prevents the material of the metallization level 110 from diffusing into a subsequently formed dielectric layer. The second etch stop layer 112 also acts as an etch stop during subsequent etching of a dielectric layer formed above the second etch stop layer 112. In at least one aspect of the invention, the second etch stop layer 112 is formed from silicon nitride, although the invention in not limited in this manner. Silicon nitride, however, has the advantage of acting as an etch stop to many etchants used to etch dielectric material, including low-k dielectric materials. The metallization level 110 can be formed from any conductive material, and in at least one current aspect, the first metallization level 110 is formed from a Cu or Cu-based alloy.

Although not limited in this manner, the thickness of the second etch stop layer 112 can be chosen so as to be sufficient to act as an etch stop during etching of the dielectric layer. In at least one aspect of the invention, the thickness of the second etch stop layer 112 is at least 20 nanometers, and in another aspect of the invention, the thickness of the second etch stop layer 112 is from about 40 to about 60 nanometers. Any process capable of depositing the second etch stop layer 112 is acceptable for use with the invention, and an illustrative process for depositing silicon nitride is PECVD.

Figure 4B:
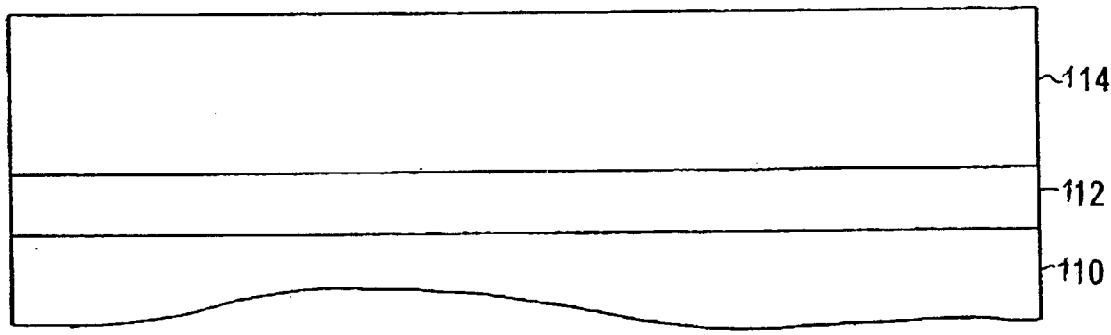

In FIG. 4B, a first dielectric layer 114 is deposited over the second etch stop layer 112. The first dielectric layer 114 can be formed from any material capable of acting as a dielectric, and illustrative materials include silicon oxide and silicon nitride. In at least one aspect of the invention, the first dielectric layer 114 is formed from a low-k dielectric material. Illustrative examples of low-k dielectric materials include fluorosilicate glass (FSG or SiOF), hydrogenated diamond-like carbon (DLC), polystyrene, fluorinated polyimides, parylene (AF-4), polyarylene ether, and polytetrafluoro ethylene. In another aspect of the invention, the first dielectric layer 114 is formed from a porous low-k dielectric material, such as siloxanes, silsesquioxanes, aerogels, and xerogels. These low-k dielectric materials can be applied via conventional spin-coating, dip coating, CVD, PECVD, spraying, meniscus coating methods, in addition to other coating methods that are well-known in the art.

Figure 4C:
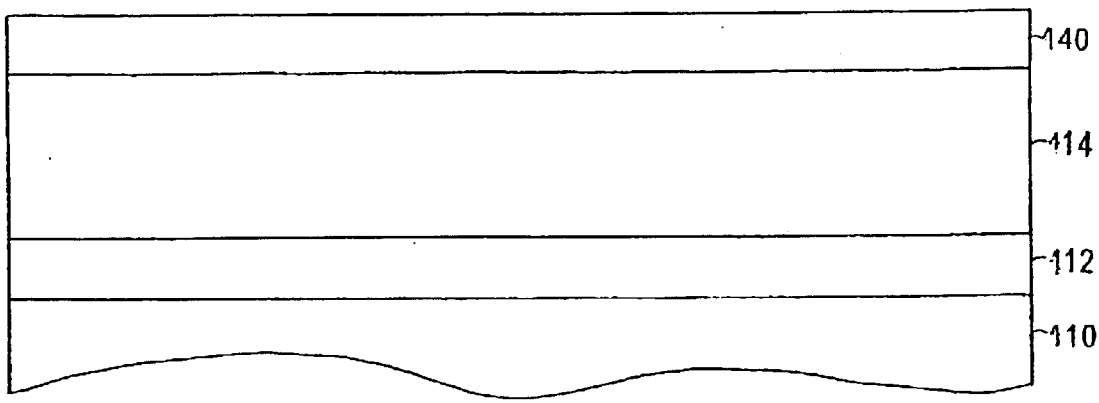

In FIG. 4C, a first etch stop layer 140 is deposited over the first dielectric layer 114. The first etch stop layer 140 acts as an etch stop during subsequent etching of the dielectric layer formed above the first etch stop layer 140. In an aspect of the invention, the first etch stop layer 140 is formed from silicon carbide, although the invention in not limited in this manner. For example, the first etch stop layer 140 can be formed from silicon nitride.

Although not limited in this manner, the thickness of the first etch stop layer 140 can be chosen so as to be sufficient to act as an etch stop during etching of the dielectric layer formed above the first etch stop layer 140. In at least one aspect of the invention, the thickness of the second etch stop layer 112 is at least 20 nanometers, and in another aspect of the invention, the thickness of the second etch stop layer 112 is from about 40 to about 60 nanometers. Any process capable of depositing the second etch stop layer 112 is acceptable for use with the invention, and an illustrative process for depositing silicon nitride is PECVD.

Figure 4D:
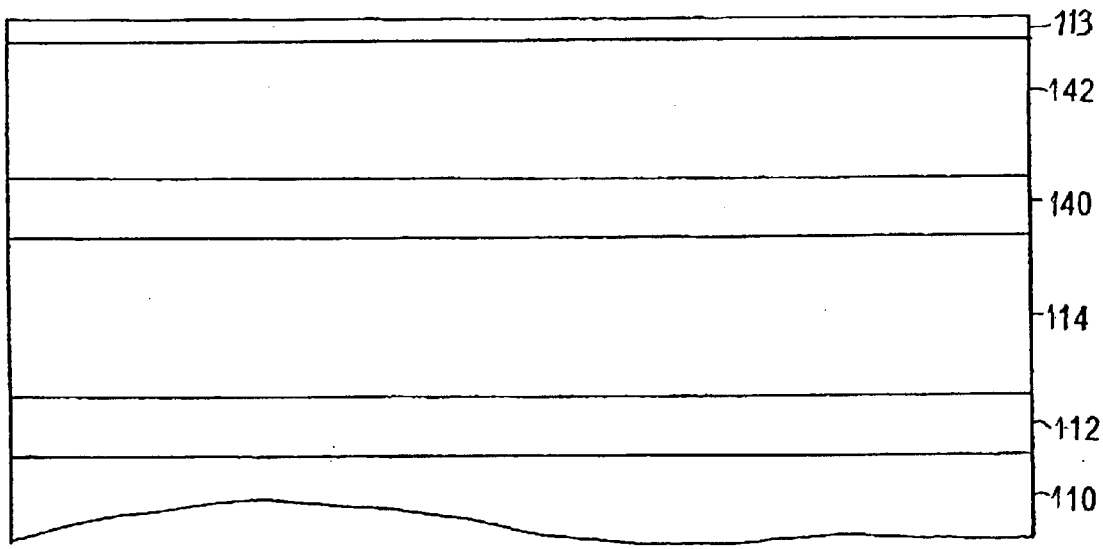

In FIG. 4D, a second dielectric layer 142 is deposited over the first etch stop layer 140. As with the first dielectric layer 114, the second dielectric layer 142 can be formed from any material suitable for use as a dielectric. In current aspects of the invention, however, the second dielectric layer 142 is formed from a low-k dielectric material.

After formation of the second dielectric layer 142, a capping layer 113 can be formed over the second dielectric layer 142. A function of the capping layer 113 can be to protect the second dielectric layer 142 from a process that removes a subsequently formed resist layer, and any material so capable is acceptable for use with the invention. The capping layer 113 can also be used as a mechanical polishing stop that reduces damage to the second dielectric layer 142 during subsequent polishing away of conductive material that is deposited over the second dielectric layer 142 and in a subsequently formed via. Examples of materials used as a capping layer 113 include silicon oxide and silicon nitride. In at least one aspect of the invention, the capping layer 113 is formed from silicon oxide and has a thickness of at least 5 nanometers. In another aspect of the invention, the thickness of the capping layer 113 is from about 40 to about 60 nanometers.

Figure 4E:
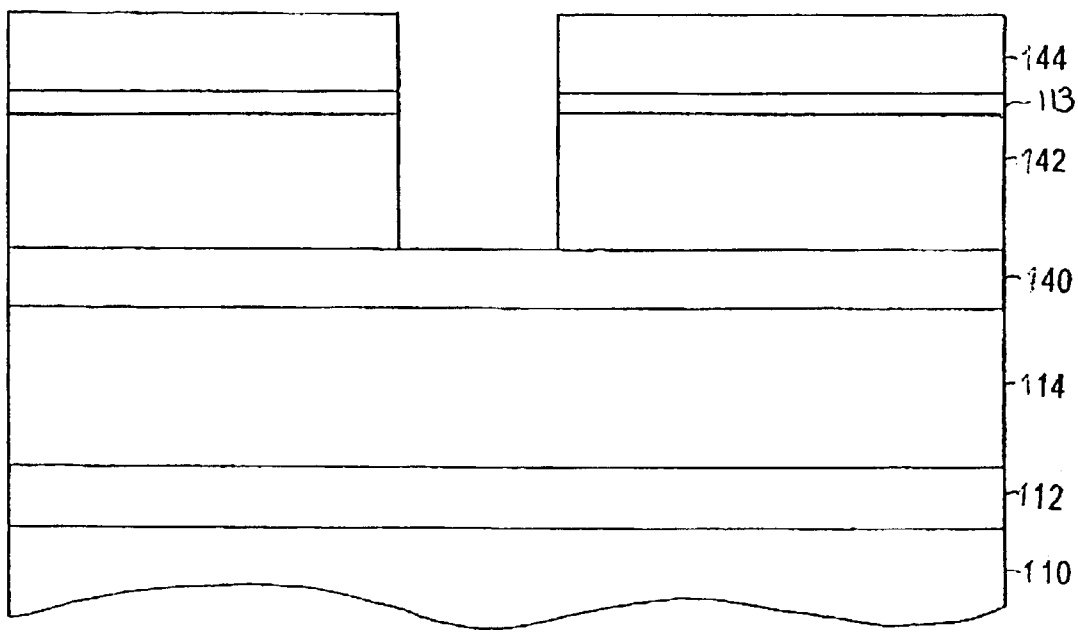

In FIG. 4E, the pattern of the via is formed in the second dielectric layer 142. The pattern of the via can be formed in the first dielectric layer 114 using any known method. One example is to use conventional lithographic techniques, for example, optical lithography (including, for example, I-line and deep-UV), X-ray, and E-beam lithography, followed by etching. The lithographic process typically involves depositing a resist 144 over the second dielectric layer 142 and exposing and developing the resist 144 to form the desired pattern of the vias.

A first etch, which is highly selective to the material of the capping layer 113 (if used) and the second dielectric layer 142, removes the capping layer 113 and second dielectric layer 142 until the etchant reaches the first etch stop layer 140. The first etch can be an anisotropic etch, such as a reactive ion plasma dry etch, that removes only the exposed portions of the second dielectric layer 142 directly below the opening in the resist 144.

Figure 4F:
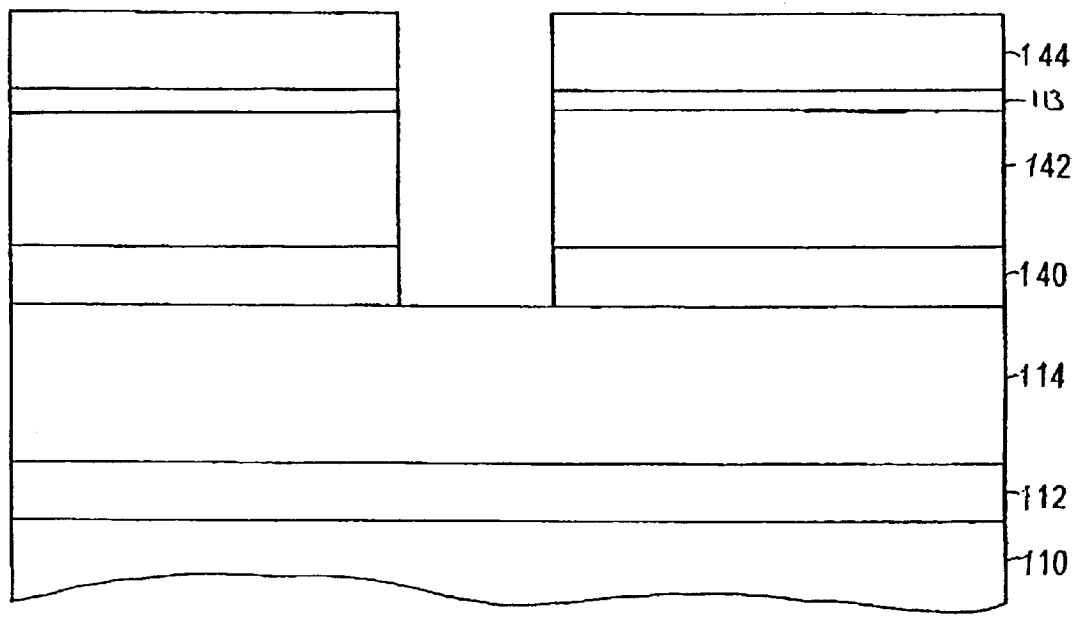

In FIG. 4F, a second etch, which is highly selective to the material of the first etch stop layer 140, removes the first etch stop layer 140 until the etchant reaches the first dielectric layer 114. The second etch can also be an anisotropic etch.

Figure 4G:
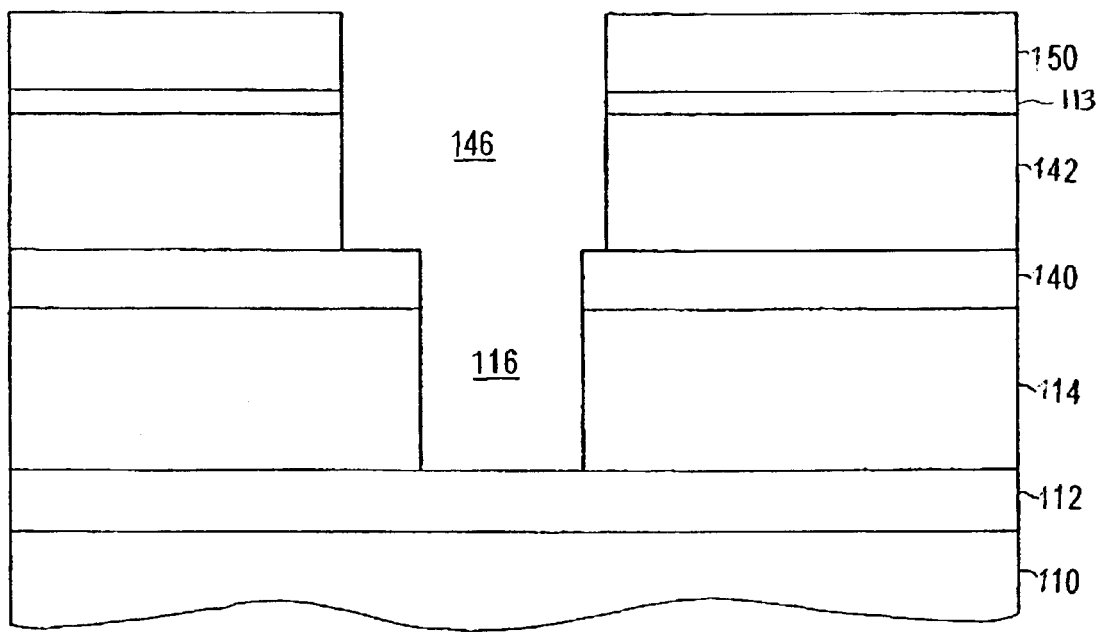

In FIG. 4G, the via 116 is formed in the first dielectric layer 114 and the trenches 146 of the second metallization level are formed in the second dielectric layer 142 using, for example, conventional lithographic and etch techniques. The lithographic process typically involves depositing a resist 150 over the second dielectric layer 142 and exposing and developing the resist 150 to form the desired pattern of the trenches 146.

A third etch, which is highly selective to the material of the capping layer 113 (if used) and first and second dielectric layers 114, 142, removes the first dielectric layer 114 until the etchant reaches the second etch stop layer 112 and removes the second dielectric layer 142 until the etchant reaches the first etch stop layer 140. The third etch can be an anisotropic etch, such as a reactive ion plasma dry etch, that removes only the exposed portions of the first dielectric layer 114 directly below the opening in the first etch stop layer 140 and the exposed portions of the second dielectric layer 142 directly below the opening in the resist 150. By using an anisotropic etch, the via 116 and the trench 146 can be formed with substantially vertical sidewalls.

Figure 4H:
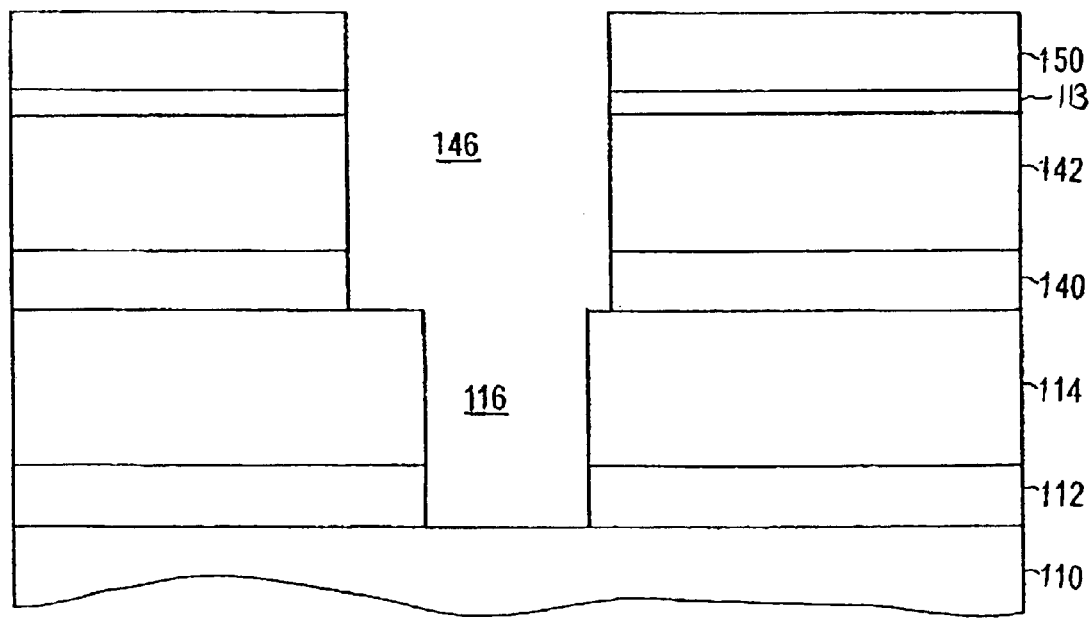

In FIG. 4H, a fourth etch, which is highly selective to the material of the first and second etch stop layers 140, 112, removes the second etch stop layer 112 until the etchant reaches the first metallization level 110 and removes the first etch stop layer 140 until the etchant reaches the first dielectric layer 114. The fourth etch can also be an anisotropic etch.

Figure 4I:
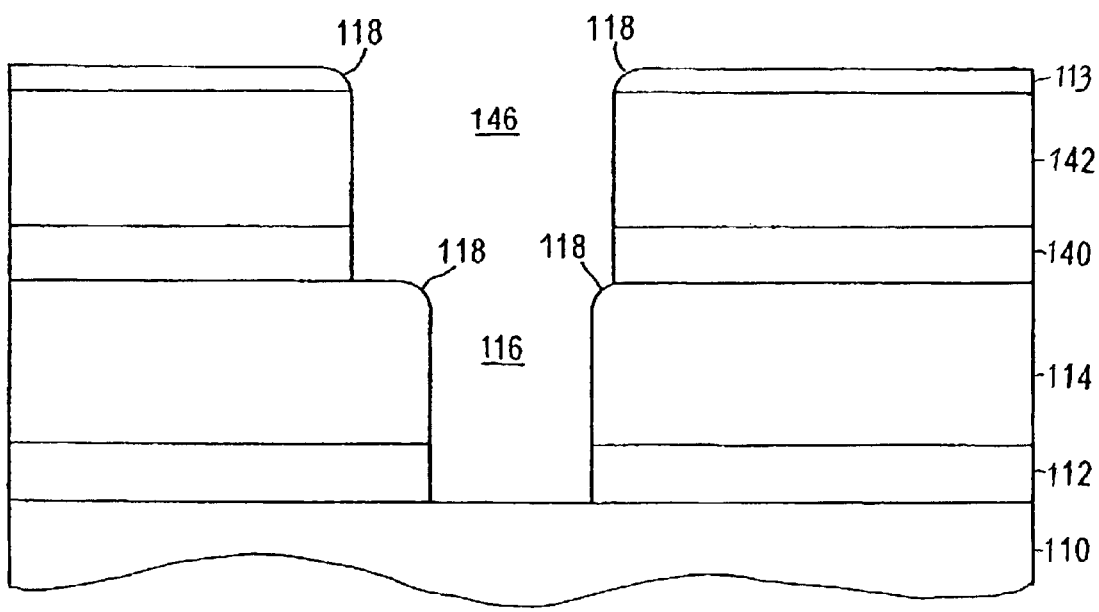

In FIG. 4I, the corners 118 of the vias 116 and trenches 146 can be rounded using a reverse sputtering process. The corners 118 of the vias 116 and trenches 146 are rounded to prevent problems of void creation associated with subsequent deposition of the conductive plug and second metallization layer, and if necessary, a barrier layer. The reverse sputtering process can also be used to clean the first metallization layer 110 at the bottom of the via 116. Incomplete etching of the second etch stop layer 112 can leave a portion of the second etch stop layer 112 over the first metallization layer 110, and this material can prevent good ohmic contact between the material of the conductive plug and the material of the first metallization layer 110. Use of the reverse sputtering process, however, can remove any remaining material of the second etch stop layer 112 and any other contaminants on the first metallization layer 110. Prior to formation of the adhesion/barrier material, the resist 150 can be removed, and the invention is not limited as to a particular manner in which the resist 117 is removed.

Figure 4J:
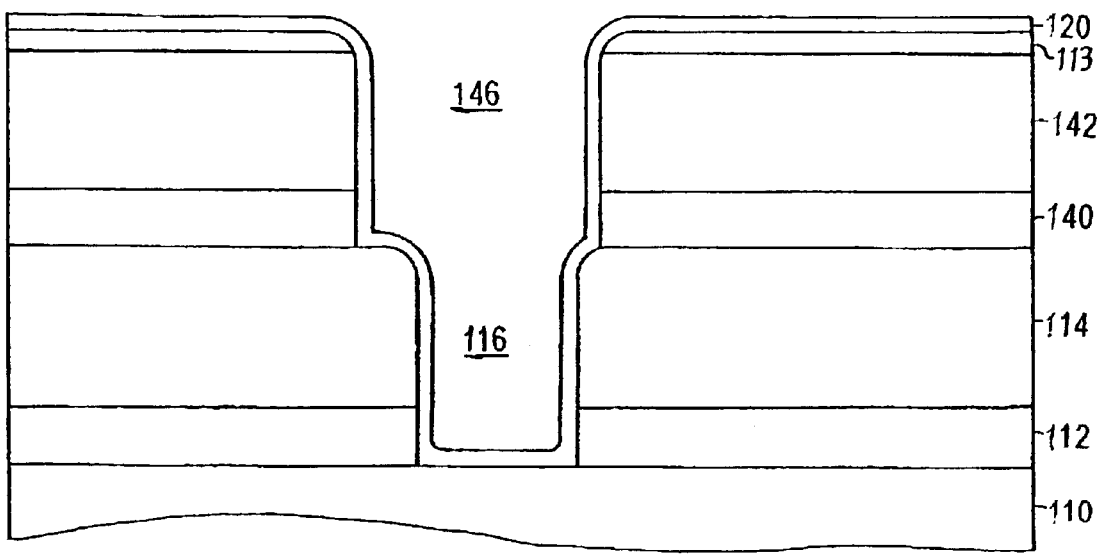

In FIG. 4J, an adhesion/barrier material, such as tantalum, titanium, tungsten, tantalum nitride, or titanium nitride, is deposited in the via 116 and trench 146. The combination of the adhesion and barrier material is collectively referred to as a first diffusion barrier layer 120. The first diffusion barrier layer 120 acts to prevent diffusion into the first and second dielectric layers 114, 142 of the conductive material subsequently deposited into the via 116 and trench 146.

Figure 4K:
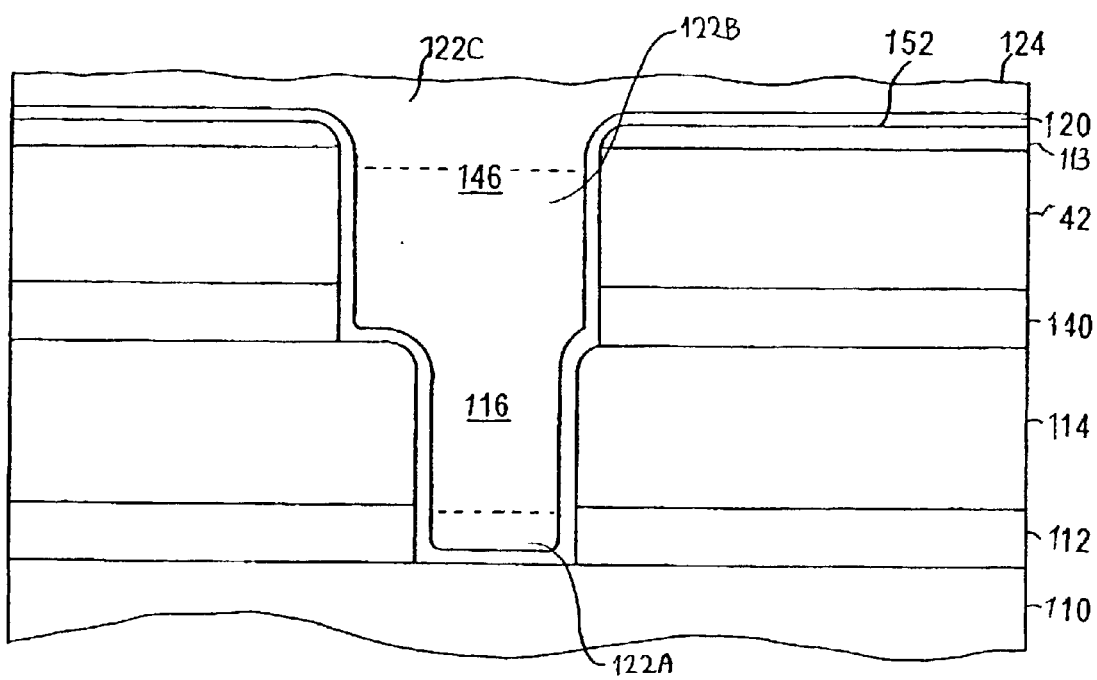

In FIG. 4K, a layer 122 of a conductive material is deposited into the via 116 and trench 146 and over the capping layer 113. In current embodiments of the invention, the conductive material is Cu or Cu-based alloy, and any process capable of depositing the conductive material into the via 116 and trench 146 is acceptable for use with this invention. As described above with regard to FIGS. 2A–2C, after the conductive material has been deposited into the via 116 and trench, dopants are introduced into the conductive material, and after the dopants have been introduced into the conductive material, the conductive material is exposed to laser thermal annealing.

Figure 4L:
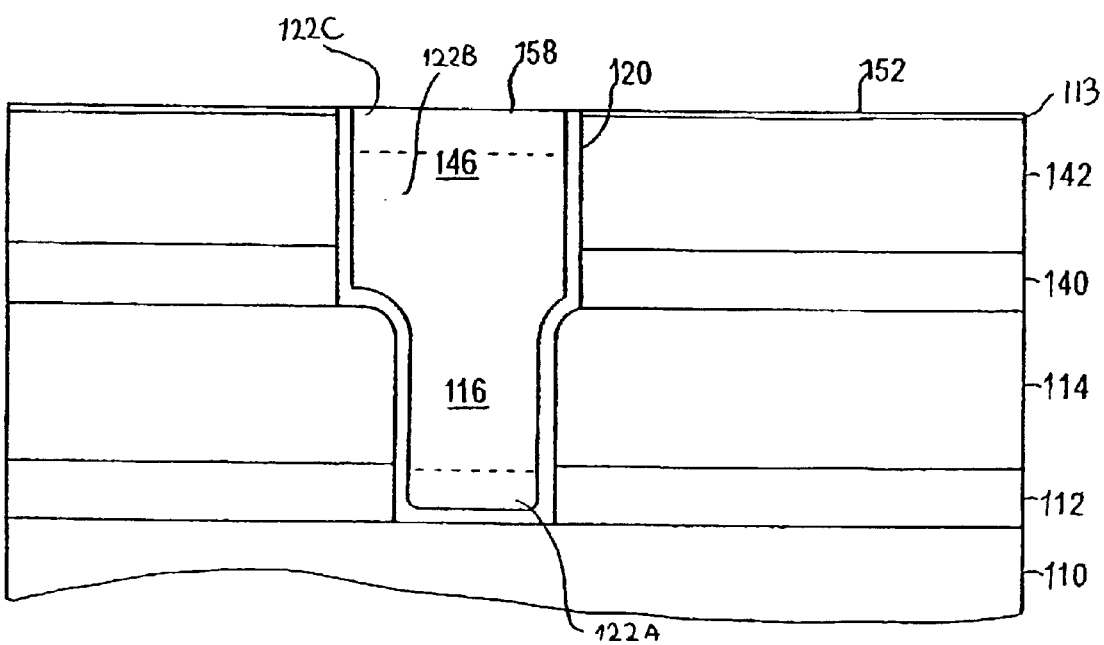

In FIG. 4L, the entire excess thickness of the metal overburden layer 124 over the upper surface 152 of the capping layer 113 is removed using a CMP process. A typical CMP process utilizes an alumina ($Al_2O_3$)-based slurry, which leaves a conductive plug in the via 116 and a second metallization level in the trench 146. The second metallization level has an exposed upper surface 158, which is substantially co-planar with the upper surface 152 of the capping layer 113.

By activating the dopants using laser thermal annealing, a reduced total energy is introduced into the semiconductor device. Furthermore, the process more evenly distributes the dopants within the conductive layer. Use of the laser thermal annealing process allows for greater process flexibility in providing multiple conductive layers having different concentrations of dopants. Although described using a single and dual damascene structures, the present invention can also be applied to other metal structures, such that a metal structure is formed; dopants are introduced into the metal structure during or after formation of the metal structure; and the metal structure is laser thermal annealed in the manner described above.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its described in the present disclosure. It is to be understood that the present in various other combinations and environments and is capable of changes scope of the inventive concept as expressed herein.

What is claimed is:

1. A semiconductor device, comprising:
    a first metallization level, said first metallization level including a first metal feature;
    a dielectric layer disposed over said metallization level;
    an opening extending through said dielectric layer to said first metal feature; and
    metal within said opening forming a second metal feature, wherein said metal includes dopants, and a concentration of said dopants within said metal in a lower portion of said second metal feature proximate said first metal feature is greater than a concentration of dopants in a central portion of said second metal feature.

2. The semiconductor device according to claim 1, wherein said opening is a via opening, a trench, or a dual damascene opening comprising a lower via opening in communication with an upper trench; and wherein said second metal feature comprises a via, a line, or a combination of a lower via in contact with an upper line, respectively.

3. The semiconductor device according to claim 1, wherein said metal and said first metallization level comprise copper (Cu) or a Cu alloy.

4. The semiconductor device according to claim 1, wherein said dopants are activated by laser thermal annealing.

5. The semiconductor device according to claim 1, wherein a concentration of said dopants within said metal in an upper portion of said second metal feature is greater than a concentration of dopants in the central portion of said second metal feature.

6. The semiconductor device according to claim 5, wherein said upper portion has a depth equal to about 5% to about 15% of a depth of said second feature.

7. The semiconductor device according to claim 1, wherein said central portion has a depth equal to about 70% to about 90% of a depth of said second feature.

8. The semiconductor device according to claim 1, wherein said lower portion has a depth equal to about 5% to about 15% of a depth of said second feature.

9. The semiconductor device according to claim 1, wherein the dopants are electromigration reducing dopants.

10. The semiconductor device according to claim 9, wherein the dopants are selected from the group consisting of palladium, nickel, tantalum, aluminum, chromium, titanium, magnesium, boron, tin, zirconium, carbon, and combinations thereof.

11. A method of manufacturing a semiconductor device, comprising the steps of:
    forming a first metallization level including a first metal feature;
    forming a dielectric layer over the first metallization layer;
    forming an opening through the dielectric layer to the first metal feature;
    filling the opening with a metal to form a second metal feature;
    introducing dopants into the metal of the second metal feature; and
    laser thermal annealing the metal of the second metal feature.

12. The method of manufacturing a semiconductor device according to claim 11, wherein the opening is a via opening, a trench, or a dual damascene opening comprising a lower via opening in communication with an upper trench; and wherein the second metal feature comprises a via, a line, or a combination of a lower via in contact with an upper line, respectively.

13. The method of manufacturing a semiconductor device according to claim 11, wherein a concentration of said dopants within said metal in a lower portion of said second metal feature proximate said first metal feature is greater than a concentration of dopants in a central portion of said second metal feature.

14. The method of manufacturing a semiconductor device according to claim 12, wherein the lower portion is laser thermal annealed before filling the opening to form the central portion.

15. The method of manufacturing semiconductor device according to claim 11, wherein a concentration of said dopants within said metal in an upper portion of said second metal feature is greater than a concentration of dopants in the central portion of said second metal feature.

16. The method of manufacturing a semiconductor device according to claim 15, wherein a concentration of said dopants within said metal in a lower portion of said second metal feature proximate said first metal feature is greater than a concentration of dopants in the central portion of said second metal feature.

17. The method of manufacturing a semiconductor device according to claim 14, wherein the lower portion is laser thermal annealed before filling the opening to form the central portion.

18. The method of manufacturing a semiconductor device according to claim 11, wherein the dopants are electromigration reducing dopants.

19. The method of manufacturing a semiconductor device according to claim 18, wherein the dopants are selected from the group consisting of palladium, nickel, tantalum, aluminum, chromium, titanium, magnesium, boron, tin, zirconium, carbon, and combinations thereof.

20. A method of manufacturing a semiconductor device, comprising the steps of:
    forming a metal feature;
    introducing dopants into the metal feature; and
    laser thermal annealing the metal feature, wherein at least one portion of the metal feature is not doped during the step of introducing dopants.

* * * * *